(12) United States Patent
Kato

(10) Patent No.: US 6,384,635 B1
(45) Date of Patent: May 7, 2002

(54) SIGNAL TRANSMITTING CIRCUIT

(75) Inventor: Jouji Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/694,316

(22) Filed: Oct. 24, 2000

(30) Foreign Application Priority Data

Oct. 28, 1999 (JP) ............................................. 11-306174

(51) Int. Cl.[7] .......................................... H03K 19/094
(52) U.S. Cl. .............................. 326/113; 326/93; 326/86
(58) Field of Search .............................. 326/86, 93, 113

(56) References Cited

U.S. PATENT DOCUMENTS 4,617,651 A * 10/1986 Ip et al. ......................... 365/200
5,012,135 A * 4/1991 Kaplinsky ..................... 307/465
6,111,433 A * 8/2000 Fotouhi et al. ................ 326/87
6,125,074 A * 9/2000 Murakami et al. ...... 365/230.06

* cited by examiner

Primary Examiner—Michael Tokar
Assistant Examiner—Anh Tran
(74) Attorney, Agent, or Firm—Junichi Mimura

(57) ABSTRACT

A signal transmitting circuit for processing an input signal at an input terminal, and for outputting the processed signal from an output terminal, includes a control circuit controlling selectively between a first condition and a second condition as to a current pass in response to a control signal, wherein the first condition indicates that the signal is prohibited from transferring to the input node so that a voltage level at the input node is held at a predetermined voltage level, and the second condition indicates that the signal is allowed to transfer to the input node so that a voltage level at the input node is no longer held at the predetermined voltage level.

24 Claims, 12 Drawing Sheets

SIGNAL TRANSMITTING CIRCUIT

CROSS-REFERENCE TO RELATED APPLICATION

This application claims the priority benefit of Japanese Patent Application No. 11-306174, filed Oct. 29, 1999, the entire disclosure of which is incorporated herein of reference.

BACKGROUND OF THE INVENTION

1. Field of the Invention

The invention relates to a signal transmitting circuit having an input node for performing a predetermined process on a signal corresponding to an input signal which is input at an input terminal, specifically from an external device, and for transmitting the processed signal to an internal circuit.

2. Description of the Related Art

Semiconductor integrated circuits (hereinafter "ICs"), are widely used in electronic devices, such as a personal computer. Such ICs receive a signal from an external above-ranking device or from another device incorporated in the electronic device together with the IC, and performs predetermined processes on the signal.

The ICs described above are prepared to synchronize the input signal to be input with a several kinds of circuits incorporated in the ICs, and to operates a particular circuit incorporated in the ICs based on the input signal. To do so, the IC includes a signal transmitting circuit for performing processes to the input signal, for example, a process for delaying the input signal for a predetermined time or a process for generating a pulse signal having a particular pulse width in response to the input signal.

Typical signal transmitting circuits, which are commonly used in the several circuits, are shown in FIGS. 12 and 13. One signal transmitting circuit 10, shown in FIG. 12, has a delay function and another signal transmitting circuit 15, shown in FIG. 13, has a pulse generating function.

Referring to FIG. 12, the signal transmitting circuit 10 includes a two-input NAND gate 11 and a delay circuit 13. The delay circuit 13 includes an even number of inverters 13-1 . . . 13-k, which are connected in series. The input of the first inverter 13-1 of the delay circuit 13 is connected to an input terminal 1 for receiving an input signal. One of the two inputs of the NAND gate 11 is connected to the input terminal 1, and another input of the NAND gate 11 is connected to the output of the last inverter 13-k of the delay circuit 13. An output terminal 3 is connected to the output of the NAND gate 11. The output terminal 3 is connected to other circuits incorporated in the IC which utilizes the output signal from the output terminal 3.

The operation of the signal transmitting circuit 10 is explained below with reference to FIG. 14. In FIG. 14, a waveform referring to IN shows a voltage level of an input signal at the input terminal 1 shown in FIG. 12. A waveform referring to A shows a voltage level at the output of the last inverter 13-k shown in FIG. 12. A waveform referring to OUT shows a voltage level of the output signal from the NAND gate 11 shown in FIG. 12.

In the initial state of the signal transmitting circuit 10, the input signal IN having a power supply voltage level (hereinafter "H level"), is input at the input terminal 1. Since the voltage at the output of the last inverter 13-k is at the H level, the voltage of the output signal OUT is maintained at a ground level (hereinafter "L level"). For purpose of illustration only, the power supply voltage and the ground voltage are assumed to be five volts (5V) and zero volt (0V), respectively.

At a time t0, when the voltage of the input signal IN, is changed from the H level to the L level, the voltage at the output of the last inverter 13-k is maintained at the L level for a certain time period defined by the number of the inverters 13-1 . . . 13k, because the input signal IN being input to the delay circuit 13 is delayed by the inverters 13-1 . . . 13-k. As a result, the voltage of the output signal OUT is changed to the H level. Then, while the voltage at the output of the last inverter 13-k is changed to the L level, the voltage of the output signal OUT is maintained at the H level.

Assuming that the voltage of the input signal IN is changed to the H level before the time t1, the voltage of the output signal OUT is maintained at the H level because the voltage at the output of the last inverter 13-k is maintained at the L level by delaying the transmittance of the input signal IN. Assuming that the voltage at the output of the last inverter 13-k is changed to the H level, the voltage of the output signal OUT is changed to the L level because the voltages of signals being input to the NAND gate 11 are at the H levels at this moment.

Therefore, the signal transmitting circuit 10 shown in FIG. 12 provides a function for maintaining the voltage of the output signal OUT at the H level during the time period between the time when the voltage level is changed to the H level form the L level and the time t1 corresponding to the delayed time delayed by the delay circuit 13.

Next, the signal transmitting circuit 15 having the pulse generating function is explained with reference to the FIG. 13. In FIG. 13, the same reference numbers as used in FIG. 12 designate the same components. Referring to FIG. 13, the signal transmitting circuit 15 includes a two-input NAND gate 11 and the delay circuit 17. The delay circuit 17 includes an odd number of inverters 17-1 . . . 17-(k+1), which are connected in series. The input of the first invert 17-1 of the delay circuit 17 is connected to an input terminal 1 for receiving an input signal. One of the input of the NAND gate 11 is connected to the input terminal 1, and another input of the NAND gate 11 is connected to the output of the last inverter 17-(k+1) of the delay circuit. An output terminal 3 is connected to the output of the NAND gate 11. The output terminal 3 is connected to other circuits incorporated in the IC, which utilizes the output signal from the output terminal 3. Namely, the only deference is that the delay circuit 17 of the signal transmitting circuit 15 shown in FIG. 13 includes the odd number of inverters while the delay circuit 13 of the signal transmitting circuit 10 shown in FIG. 12 includes the even number of inverters.

The operation of the signal transmitting circuit 15 is explained below with reference to FIG. 15. In FIG. 15, a waveform referring to B shows a voltage level on an output of the last inverter 17-(k+1) shown in FIG. 13. In the initial state of the signal transmitting circuit 15, the input signal IN, having the H level is input at the input terminal 1. Since the voltage at the output of the last inverter 17-(k+1) shows at the L level, the voltage of the output signal OUT is maintained at the H level.

At a time t0, when the voltage level of the input signal IN is changed from the H level to the L level, the voltage at the output of the last inverter 17-(k+1) is maintained at the L level for a certain time period defined by the number of the inverters, because the input signal IN being input to the delay circuit 17 is delayed by the inverters 17-1 . . . 17-(k+1).

As a result, the voltage of the output signal OUT is maintained at the H level. Then, while the voltage at the output of the last inverter 17-(k+1) is changed to the H level, the voltage of the output signal OUT is maintained at the H level. Then, while the voltage at the output of the last inverter 17-(k+1) is changed to the L level, the voltage of the output signal OUT is maintained at the H level.

Assuming that the voltage of the input signal IN is changed to the H level before the time t1, the voltage of the output signal OUT is changed to the L level because the voltages of signals being input to the NAND gate 11 are at the H levels at this moment. Assuming that the voltage at the output of the last inverter 17-(k+1) is changed to the L level, the voltage of the output signal OUT is changed to the H level because one of the voltages of signals being input to the NAND gate 11 is at the L levels at this moment.

Therefore, the signal transmitting circuit 15 shown in FIG. 13 provides a function for maintaining the voltage level of the output signal OUT at the L level during the time period that the input signal IN is delayed by the delay circuit 17 so as to generate a pulse signal having a width corresponding to the time period between the time t1 and the time t2. As described above, the signal transmitting circuit processes an input signal and transmits the signal processed to other circuits incorporated in the IC.

If an unexpected signal such as noise is input to the input terminal 1 of these signal transmitting circuits, the operations of these signal transmitting circuits are explained as follows. First, the operation of the signal transmitting circuit 10 shown in FIG. 12 is explained with reference to FIG. 14, assuming that the noise is input to the input terminal 1 at the time t2 and the voltage level of the input signal IN has fallen. If the change of the voltage level of the input signal IN exceeds a threshold voltage of MOS transistors forming the NAND circuit 11 or MOS transistors forming inverters 13-1 through 13-k of the delay circuit 13, the output signal OUT at the output terminal 3 is changed to the H level. Later, since the voltage of the input signal IN is returned to the H level at the time t3, the voltage of the output signal OUT is changed to the L level. However, at the time t4 which is just after the time t3, the voltage at the output of the last inverter 13-k is changed to the L level by the noise that is delayed by the delay circuit 13. Therefore, the voltage of the output signal OUT is changed to the H level again. If the change of the voltage level of the input signal IN caused by the noise appearing at the output terminal 3 as the change of the voltage level of the output signal OUT, the other circuits connected to the output terminal 3 operate unexpectedly as a result of the change of the voltage level of the output signal OUT, which responds to the noise.

Next, the operation of the signal transmitting circuit 15 shown in FIG. 13 is explained with reference to FIG. 15, assuming that the noise is input to the input terminal 1 at the time t3 and the voltage level of the input signal IN has fallen. If the change of the voltage level of the input signal IN exceeds a threshold voltage of MOS transistors forming the NAND circuit 11 or MOS transistors forming inverters 17-1 through 17-(k+1) of the delay circuit 17, the voltage level at the output of the last inverter 17-(k+1) is changed to the H level by the noise that is delayed by the delay circuit 13 at the time t4 after the voltage of the input signal IN is returned to the H level. Therefore, since the voltage of the output signal OUT is changed to the H level, a pulse signal having a short width is generated unexpectedly. If the change of the voltage level of the input signal IN caused by the noise appearing at the output terminal 3 as the change of the voltage level of the output signal OUT, the other circuits connected to the output terminal 3 operate unexpectedly as a result of the change of the voltage level of the output signal OUT, which responds to the noise, as well as the signal transmitting circuit 10 shown in FIG. 12. Accordingly, in the conventional signal transmitting circuit, the IC as a whole is caused to malfunction by noise or an unexpected input signal occurring due to the malfunctioning the external device.

SUMMARY OF THE INVENTION

An objective of the invention is to resolve the-above-described problem and to provide a signal transmitting circuit that causes the circuit connected to the output terminal of the signal transmitting circuit not to malfunction as a result of the noise or an unexpected input signal.

A further objective of the invention is provide the above-mentioned signal transmitting circuit suppressing the increase of number of components forming the signal transmitting circuit, the increase of number of output terminal of the IC incorporating the signal transmitting circuit and the increase of number of external control signals which are necessary to achieve the purpose.

The objective is achieved by a signal transmitting circuit for processing an input signal at an input terminal, and for outputting the processed signal from an output terminal, including a control circuit controlling selectively between a first condition and a second condition as to a current pass in response to a control signal, wherein the first condition indicates that the signal is prohibited from transferring to the input node so that a voltage level at the input node is held at a predetermined voltage level, and the second condition indicates that the signal is allowed to transfer to the input node so that a voltage level at the input node is no longer held at the predetermined voltage level.

Further, a signal transmitting circuit includes terminals, which receive external control signals, and a control signal generating circuit.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
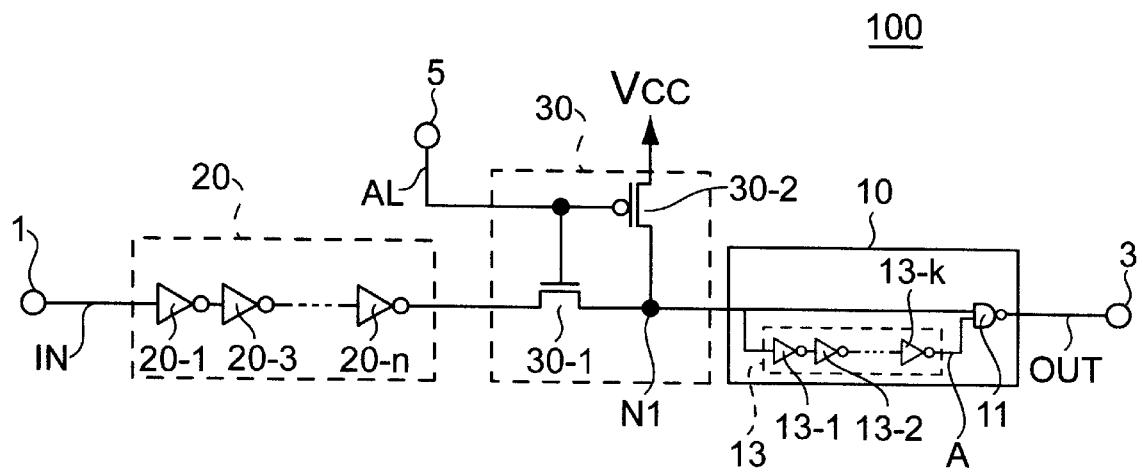
FIG. 1 is a circuit diagram of a signal transmitting circuit of a first embodiment of the invention.

The preferred embodiments of a signal transmitting circuit of the invention are described as follows with reference to the drawings. In the following detailed description, the same reference numbers in the drawings designate the same or similar components. Further, in each of the preferred embodiments, the signal transmitting circuits as described below, are embodied by a semiconductor integrated circuit (hereinafter "IC").

Figure 12:
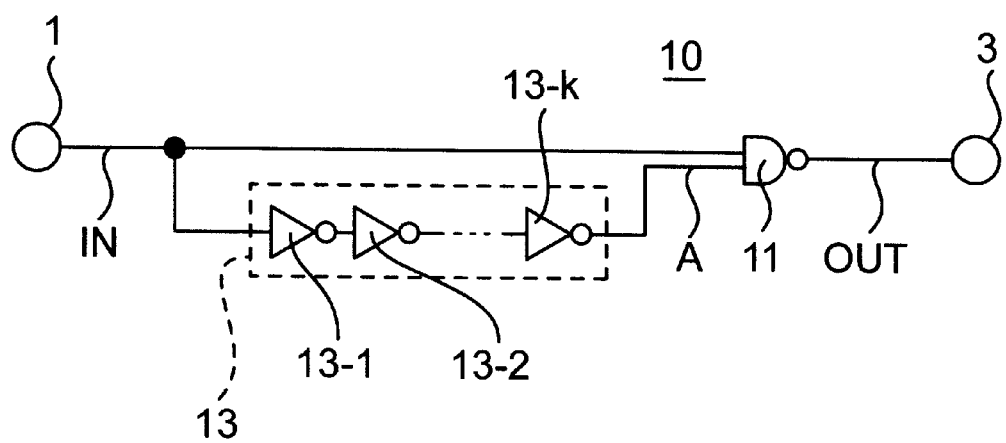
FIG. 12 is a circuit diagram of a signal transmitting circuit in the related arts having a delay function.

Referring to FIG. 1, a signal transmitting circuit 100 of a first embodiment includes a delay circuit 20, and a control circuit 30 having a terminal 5, in addition to a signal transmitting circuit 10 that is the same as the signal transmitting circuit shown in FIG. 12. The delay circuit 20 and the control circuit 30 are placed between the input terminal 1 and an input node 1 of the transmitting circuit 10. A control signal AL, which is to be explained below, is input to the control circuit 30 through the terminal 5.

The delay circuit 20 includes an even number of inverters 20-1 . . . 20-n connected in series. The input of the first inverter 20-1 of the delay circuit 20 is connected to the input terminal 1 for receiving an input signal IN. The delay circuit 20 outputs a signal corresponding to a voltage level of the input signal IN, from the last inverter 20-n after a time delay defined by the number of the inverters 20-1 . . . 20-n.

The control circuit 30 includes an N channel type MOS transistor (hereinafter "NMOS transistor") 30-1 and P channel type MOS transistor (hereinafter "PMOS transistor") 30-2. The drain electrode of the NMOS transistor 30-1 is connected to the output of the last inverter 20-n of the delay circuit 20. The source electrode of the NMOS transistor 30-1 is connected to the node N1. The drain electrode of the PMOS transistor 30-2 is connected to the power supply Vcc, and the source electrode of the PMOS transistor 30-2 is connected to the node N1. Both gate electrodes of the PMOS transistor 30-1 and the NMOS transistor 30-2 are commonly connected to the terminal 5 to which the control signal AL is applied.

In the control circuit 30, when the voltage level of the control signal AL is at a ground voltage level (hereinafter "L level"), the NMOS transistor 30-1 is in an off-state and the PMOS transistor 30-2 is in an on-state. Therefore, the signal from the inverter 20-n is not transferred to the node N1. However, since the PMOS transistor 30-2 is in the on-state, the voltage level of the node N1 is maintained at a power supply voltage level (hereinafter "H level").

When the voltage level of the control signal AL is at the H level, the NMOS transistor 30-1 is in the on-state and the PMOS transistor 30-2 is in the off-state. Therefore, the signal from the inverter 20-n is transferred to the node. Since the PMOS transistor 30-2 is in the off-state, the voltage level at the node N1 corresponds to the voltage level of the signal from the inverter 20-n.

Therefore, the control circuit has a function to select either a first condition in which a signal is prohibited from transferring to the node N1 so that the voltage level at the node N1 is held at a predetermined voltage level, or a second condition in which a signal is transferred to the node N1 so that the voltage level at the node N1 is no longer held at the predetermined voltage level. As described above, the elements of the signal transmitting circuit 10 of FIG. 1, including the delay circuit 13, are illustrated in FIG. 12. In FIG. 1, the node N1 corresponds to the input terminal 1 in FIG. 12. Therefore, the signal applied to the node N1 is input to the first inverter 13-1 of the delay circuit 13 and one of the inputs of the NAND gate 11.

In FIG. 1, both inverters 13-1 . . . 13k of the delay circuit 13, and the delay circuit 20, delay the input signal applied to the input terminal 1. Therefore, if it is necessary to obtain a particular delay that is defined by the time period from when the input signal IN is input to the input terminal 1 to when the output signal OUT is output from the output terminal 3, in the signal transmitting circuit 100, the delay should be calculated to include both the delay defined by the delay circuit 20 and the delay defined by the delay circuit 13. If the number of the inverter 13-1 . . . 13k of the signal transmitting circuit 10 is reduced, then the delay circuit 20 can be formed with the same number of the inverters as the number of inverters by which the circuit 10 is reduced. Thus the total number of the inverters in the signal transmitting circuit 100 and thus the total delay, is not changed.

Figure 2:
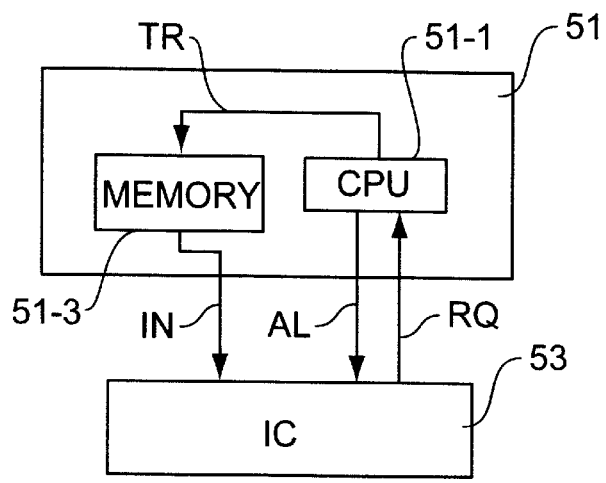
FIG. 2 is a block diagram of a semiconductor integrated circuit incorporating the signal transmitting circuit shown in FIG. 1 and its peripheral circuits.

Next, the time when the control signal AL is generated is explained with reference to FIG. 2. In FIG. 2, the semiconductor IC 53, incorporating the signal transmitting circuit 100 and its peripheral circuit 51, is illustrated.

Referring to FIG. 2, the peripheral circuit 51, which may be a one-chip microcomputer, includes a central processing unit (hereinafter "CPU") 51-1, and a semiconductor memory, such as a dynamic random access 51-3. The CPU 51-1 receives a request signal RQ for instructing data transfer from the semiconductor IC 53. The CPU 51-1 understands from the request signal RQ that the data transfer is requested, when the voltage level of the request signal RQ is at the H level, and understands that the data transfer is not requested, when the voltage level of the request signal RQ is at the L level.

The CPU 51-1 outputs a transfer-instruction signal TR that allows data to be read from the memory 51-3, in accordance with the voltage level of the signal RQ. To be concrete, the CPU 51-1 outputs the transfer-instruction signal TR at the H level when the voltage level of the signal RQ is at the H level, and the CPU 51-1 outputs the transfer-instruction signal TR at the L level when the voltage level of the signal RQ is at the L level.

In response to the voltage level of the signal TR, the memory 51-3 is controlled to output the data as the input signal IN that is read out based on address information (not illustrated in the drawings). That is, the memory 51-3 is activated when the voltage level of the signal TR is at the H level, and the memory 51-3 can output the read-data based on address information as the input signal IN. When the voltage level of the signal TR is at the L level, reading of data or outputting read data cannot be performed.

The CPU 51-1 also outputs the control signal AL as an allowance signal when the signal TR is output. When the voltage level of the signal TR is at the H level, the control signal AL is output at the H level, and when the voltage level of the signal TR is at the L level, the control signal AL is output at the L level. The CPU 51-1 can output the control signal AL at the H level for a certain time period until the input signal IN is transferred to the signal transmitting circuit 10, and then the voltage level of the control signal AL can be returned to the L level. The time period can be set by including a counter in the peripheral circuit 51.

According to the composition described above, the control circuit can be set in the second condition with the time at which the voltage level of the signal TR becomes the H level, in other words, with the time at which the data read out from the memory 51-3 is received as the input signal IN at the input terminal 1. Although, it is necessary to cause the control circuit 20 to attain the second condition before the time at which the data read out from the memory 51-3 is received as the input signal IN at the input terminal 1 so as to input the data read out from the memory 51-3 to the signal transmitting circuit 10, it is possible to cause the control circuit 20 to attain the second condition before the time at which the data read out from the memory 51-3 is received as the input signal IN at the input terminal 1 because the delay circuit for delaying receipt of the input signal IN by the control circuit 30 is provided between the input terminal 1 and the control circuit 30.

However, if it is possible to cause the control circuit 20 to attain the second condition before the time at which the data read out from the memory 51-3 is received as the input signal IN at the input terminal 1 by other alternatives, them it is not necessary to provide a delay circuit between the input terminal 1 and the control circuit 30. In that case, it is not necessary to change the number of inverters 13-1 . . . 13-k in the signal transmitting circuit 10, and therefore, it is also not necessary to changing the circuit design of the signal transmitting circuit 10 of the related arts.

Figure 3:
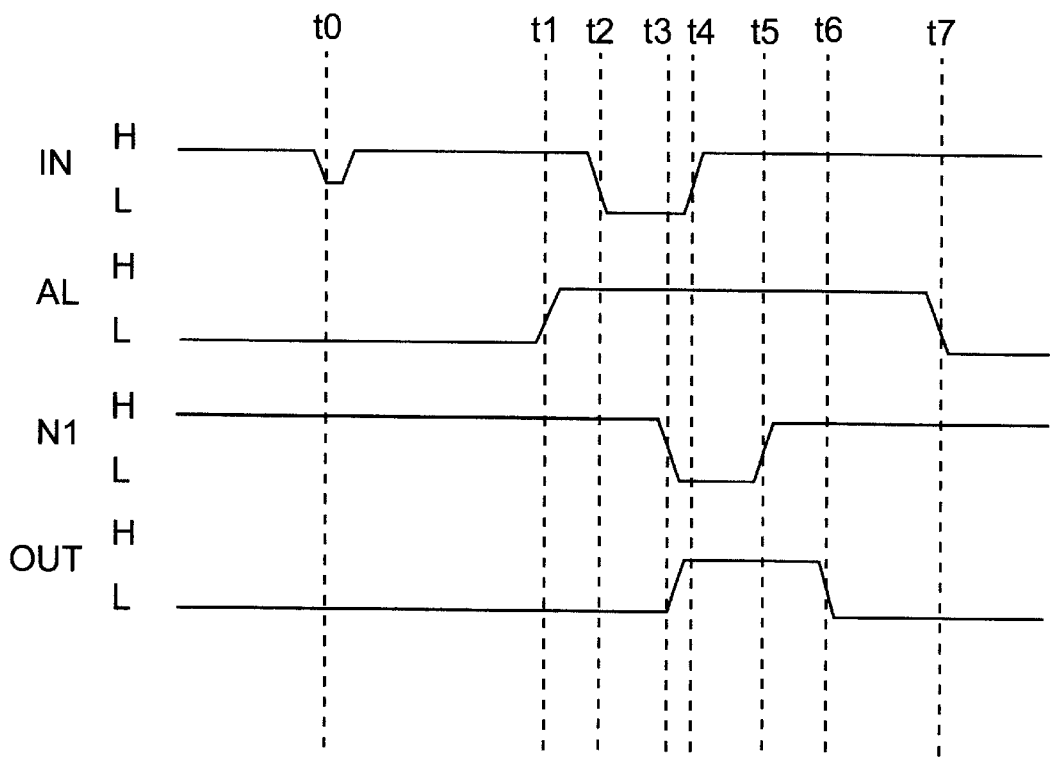
FIG. 3 is a timing chart illustrating operation of the signal transmitting circuit shown in FIG. 1.

Next, the operation of the signal transmitting circuit 100 shown in FIG. 1 is explained with reference to the FIG. 3. Referring to FIG. 3, initially, the voltage levels of the input signal IN and the control signal AL are set to the H level and the L level, respectively. Therefore, the control circuit is initially in the first condition, so that the voltage at the node N1 is maintained at the H level. Accordingly, the voltage of the output signal OUT from the signal transmitting circuit 10 is at the L level.

At the time t0, the peripheral circuit 51 is not ready for transferring the data so that the voltage level of the control signal AL is maintained at the L level. Therefore, even if the voltage level of the input signal IN is changed by noise from the H level to the L level, the voltage level at the node N1 is maintained at the H level. Thus, even with such noise, the output signal OUT is maintained at the L level, because an H level signal is input to the signal transmitting circuit 10.

After a particular time period has passed, at the time t1, the peripheral circuit 51 is ready to transfer the data, and the voltage of the control signal AL rises to the H level. Therefore, the control circuit 30 is in the second condition. At the time t2, the voltage level of the input signal IN drops to the L level as a result of transferring the data from the peripheral circuit 51. Since the change of the voltage level of the input signal IN is transferred to the node N1 through the delay circuit 20 and the control circuit 30, the voltage at the node N1 changes to the L level at the time t3. Therefore, the voltage of the output signal OUT rises to the H level.

At the time t4, although the voltage level of the input signal IN increases to the H level, the voltage at the node N1 remains at the L level because the transfer of the input signal to the node N1 is delayed by the delay circuit 20 and the control circuit 30. At the time t5, the voltage at the node N1 returns to the H level because the input signal IN reaches to the node N1. At the time t6, the voltage level of the output signal OUT returns to the L level after a time delay defined by the signal transmitting circuit 10, whereby the input signal IN that was input to the input terminal 1 at the time t2 is output from the output terminal 3 as the output signal OUT after a desired time delayed (t6-t2). At the time t7, since the voltage level of the control signal AL returns to the L level, the signal transmitting circuit 100 is in a state similar to the initial state.

Thus, according to the first embodiment of the invention, even if the voltage level of the input signal has been changed by the noise, the signal transmitting circuit 100 can prevent a transfer of the change to the signal transmitting circuit 10. Therefore, it is possible to avoid the malfunctioning of the other circuit that is operated by the output signal OUT.

Furthermore, in the first embodiment, since only some additional transistors that form the control circuit 30, and the terminal 5 that receives the control signal AL are added to the signal transmitting circuit 10 to create the signal transmitting circuit of the invention, its manufacturing cost and process complexity are increased only minimally.

Figure 4:
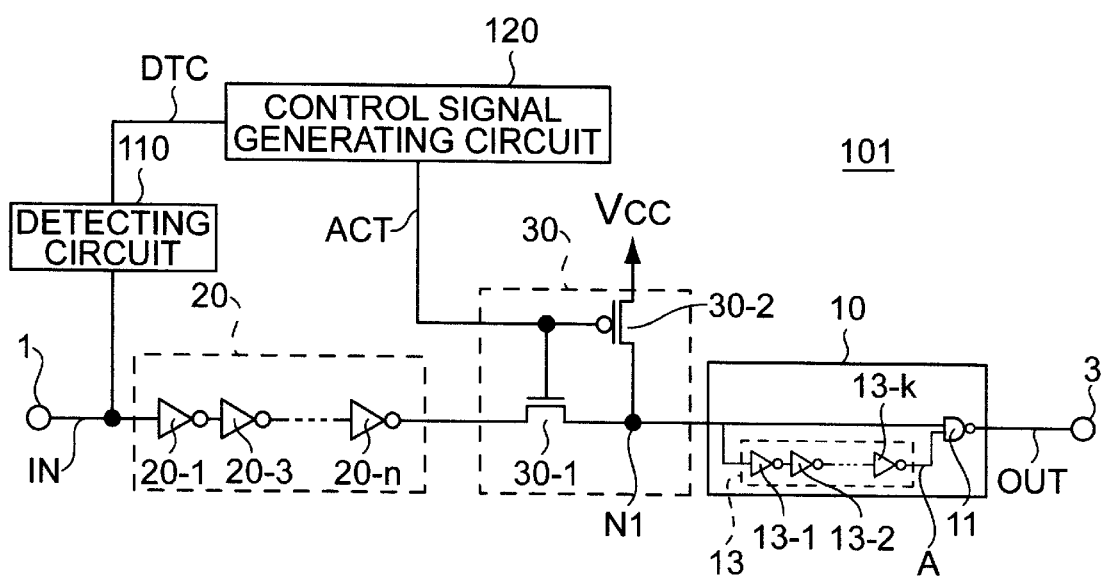
FIG. 4 is a circuit diagram of a signal transmitting circuit of a second embodiment of the invention.

A second embodiment of the invention is explained with reference to FIGS. 4 through 7. FIG. 4 shows a circuit diagram of a signal transmitting circuit 101 of the second embodiment of the invention. The same reference numbers in FIG. 1 and FIG. 4 designate the same or similar components.

Comparing to the signal transmitting circuit 100 shown in FIG. 1, the signal transmitting circuit 101 shown in FIG. 4 further includes a detecting circuit 110 and a control signal generating circuit 120 as a replacement of the terminal 5 shown in FIG. 1. Other components of the signal transmitting circuit 101 are the same or similar to the components of the signal transmitting circuit 100.

Figure 5:
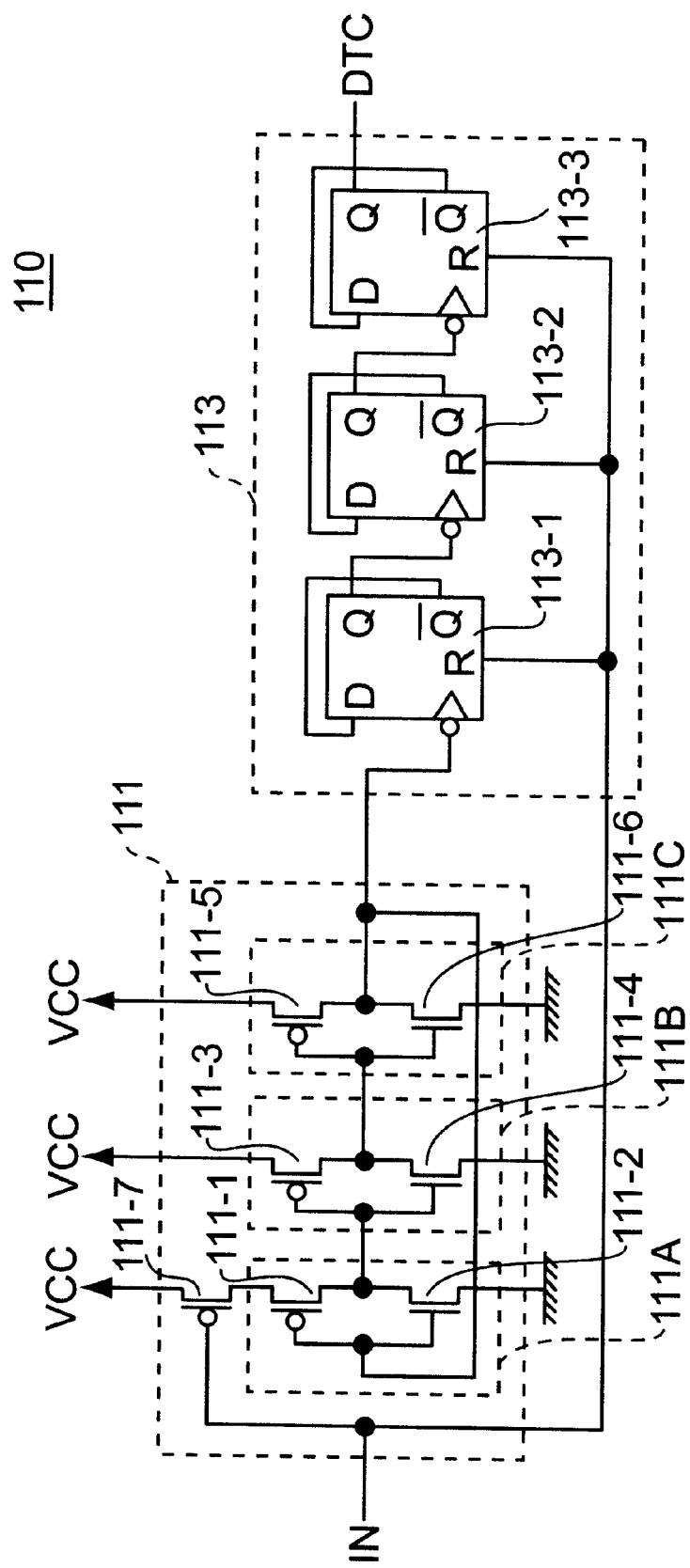
FIG. 5 is a circuit diagram of a detecting circuit.

Referring to FIG. 5, the detecting circuit 110 includes an oscillating circuit 111 and a counting circuit 113. The oscillating circuit 111 includes four PMOS transistors 111-1, 111-3, 111-4 and 111-7 and three NMOS transistors 111-2, 111-4 and 111-6. The drain of each PMOS transistor 111-7, 111-3, 111-5 is connected to the power supply voltage Vcc. The source of the PMOS transistor 111-7 is connected to the drain of the PMOS transistor 111-1. The sources of the PMOS transistors 111-1, 111-3, 111-5 are respectively connected to the drains of the NMOS transistors 111-2, 111-4, 111-6. The sources of the transistor 111-2, 111-4, 111-6 are connected to the ground voltage Vss.

The gate of the PMOS transistor 111-7 receives the input signal IN. The gates of the PMOS transistor 111-1 and the NMOS transistor 111-2 are commonly connected to the source of the PMOS transistor 111-5. The gates of the PMOS transistor 111-3 and the NMOS transistor 111-4 are commonly connected to the source of the PMOS transistor 111-1. The gates of the PMOS transistor 111-5 and the NMOS transistor 111-6 are commonly connected to the source of the PMOS transistor 111-3.

The oscillating circuit 111 is called as a ring oscillating circuit because a first inverter 111A consisting of the PMOS transistor 111-1 and NMOS transistor 111-2, a second inverter 111B consisting of the PMOS transistor 111-3 and NMOS transistor 111-4, and a third inverter 111C consisting of the PMOS transistor 111-5 and NMOS transistor 111-6 are connected in a ring as described above. Therefore, the operation of the oscillating circuit 111 is controlled in response to the voltage level of the input signal IN. In other words, when the input signal IN is at the H level, the PMOS transistor 117 is in the off-state. Therefore, since the first inverter 111A consisting of the PMOS transistor 111-1 and NMOS transistor 111-2 is not activated, the oscillating circuit 111 is not operated.

When the input signal IN is at the L level, the PMOS transistor 117 is in the on-state. Therefore, since the first inverter 111A consisting of the PMOS transistor 111-1 and NMOS transistor 111-2 is activated, the oscillating circuit 111 is operated. That is, the oscillating circuit 111 is operated while the input signal IN is at the L level.

During the period that the oscillating circuit 111 is operated, the oscillating circuit 111 generates a pulse signal having a desired period, and the pulse signal is output as a output signal of the oscillating circuit 111 from the source of the PMOS transistor 111-5. That is, the oscillating circuit 111 generates a pulse signal having a desired time period during the period that the voltage level of the input signal IN is at the L level, by detecting the data transferred as the input signal IN, i.e., by detecting the change of the voltage level of the input signal IN from the H level to the L level.

The counting circuit includes three D-type flip-flop circuits (hereinafter "FF circuits") 113-1, 113-2 and 113-3. A data terminal D of each FF circuit 113-1, 113-2, 113-3 is connected to its reverse output terminal/Q. A reset terminal R of each FF circuit 113-1, 113-2, 113-3 receives the input signal IN. A clock terminal of the FF circuit 113-1 receives the output signal from the oscillating circuit 111. A clock terminal of the FF circuit 113-2 is connected to an output terminal Q of the FF circuit 113-1. A clock terminal of the FF circuit 113-3 is connected to an output terminal Q of the FF circuit 113-2. The output signal from the output terminal Q of the FF circuit 113-3 is used as a detecting signal DTC, which is explained below.

The operation of the counting circuit 113 is explained as follows. When the voltage level of the input signal is at the H level, in other words, when the oscillating circuit 111 is not operated, a reset condition of each FF circuit 113-1, 113-2, 113-3 is maintained because the signal having the H level is input to the reset terminal R of each FF circuit 113-1, 113-2, 113-3. Therefore, the voltage level of the detecting signal DTC is at the L level.

When the voltage level of the input signal is at the L level, in other words, when the oscillating circuit 111 is operated, each FF circuit 113-1, 113-2, 113-3 is released from a reset condition, and each of FF circuits 113-1, 113-2 and 113-3 are in an operable condition. Under these circumstances, whenever the pulse signal from the oscillating circuit 111 has fallen, the voltage level of the output signal from the output terminal Q of the FF circuit 113-1 changes from the H level to the L level or from the L level to the H level.

Whenever the voltage level of the signal from the output terminal Q of the FF circuit 113-1 changes from the H level to the L level, the voltage level of the output signal from the output terminal Q of the FF circuit 113-2 changes from the H level to the L level or from the L level to the H level. Similarly, whenever the voltage level of the signal from the output terminal Q of the FF circuit 113-2 is changed from the H level to the L level, the voltage level of the output signal from the output terminal Q of the FF circuit 113-3 changes from the H level to the L level or from the L level to the H level Therefore, when the pulse signal from the oscillating circuit 111 has fallen four times, in other words, when the oscillating circuit 111 generates a pulse signal having four pulses, the counting circuit 113 causes the voltage level of the detecting signal DTC to attain the H level. Accordingly, the detecting signal DTC switches to the H level where the voltage level of the input signal IN has been maintained at the L level for a time period for which the pulse signal having four pulses is generated. If noise is input from the input terminal 1, the voltage level of the input signal IN is not at the L level for the time period for which the pulse signal having four pulses is generated. Therefore, the voltage level of the detecting signal DTC is maintained at the L level.

The number of the FF circuit can be increased in response to the time for which the voltage level of the input signal IN has been maintained at the L level by the noise so that the signal to be transferred and the noise can be distinguished precisely. Further, instead of the increase of the number of the FF circuit, it is possible to adjust the period of the pulse of the pulse signal by increasing the number of inverters in the oscillating circuit 111 so as to distinguish the signal to be transferred from the noise.

Figure 6:
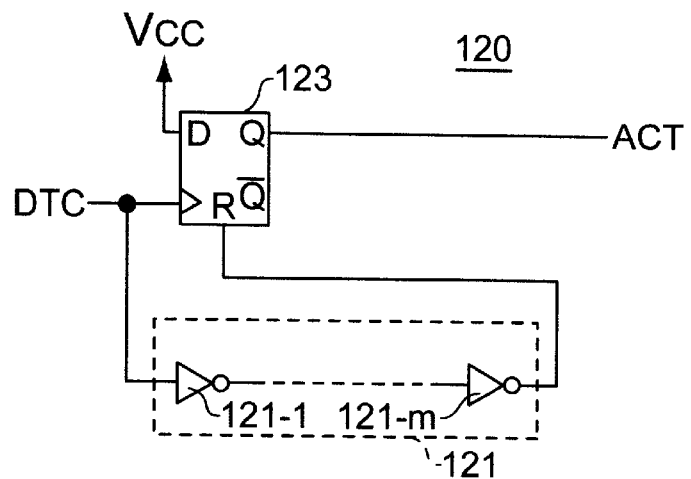
FIG. 6 is a circuit diagram of a control signal generating circuit.

Referring to FIG. 6, the control signal generating circuit 120 includes a FF circuit 123 and a delay circuit 121. The power supply voltage Vcc is applied to a data terminal D of the FF circuit 123, and the detecting signal DTC is input to the clock terminal of the FF circuit 123. The FF circuit 123 outputs a control signal ACT, which corresponds to the control signal AL in FIG. 1, from an output terminal Q.

The delay circuit 121 includes an even number of inverters 121-1 ... 121-m connected in series. The detecting signal DTC is input to the first inverter 121-1, and an output signal from the last inverter 121-m is input to a reset terminal R of the FF circuit 123.

When the voltage of the detecting signal DTC is at the L level, the FF circuit 123 outputs the control signal ACT at the L level. In response to a change of the voltage level of the detecting signal DTC from the L level to the H level, the FF circuit 123 changes the voltage level of the control signal ACT from the L level to the H level. After particular time period has been passed, although the voltage of the detecting signal DTC has returned to the L level in response to the change of the voltage level of the input signal IN, the voltage of the control signal ACT is maintained at the H level because the transmission of the change of the voltage level of the detecting signal DTC to the reset terminal R of the FF circuit 123 is delayed by the delay circuits for a particular time period which is defined by the number of the inverters 121-1 ... 121-m. After the particular time period has passed, the output signal from the delay circuit 121 is input at the H level to the reset terminal R of the FF circuit 123, and the voltage level of the control signal ACT returns to the L level.

Therefore, the control signal generating circuit 120 causes the voltage level of the control signal ACT to attain the H level for the particular time period that is defined by the number of the inverters 121-1 ... 121-m when the voltage level of the detecting signal DTC is at the H level. The control signal ACT is input to the control circuit 30.

According to the composition described above, the control circuit 30 is in the second condition while the voltage level of the control signal ACT is at the H level, and is otherwise in the first condition. The time period that the control circuit 30 is maintained in the second condition is determined by the length of the delay caused by the delay circuit 121. Therefore, it is possible to set the time period that the control circuit 30 is maintained in the second condition by setting the number of the inverters 121-1 ... 121-m.

Figure 7:
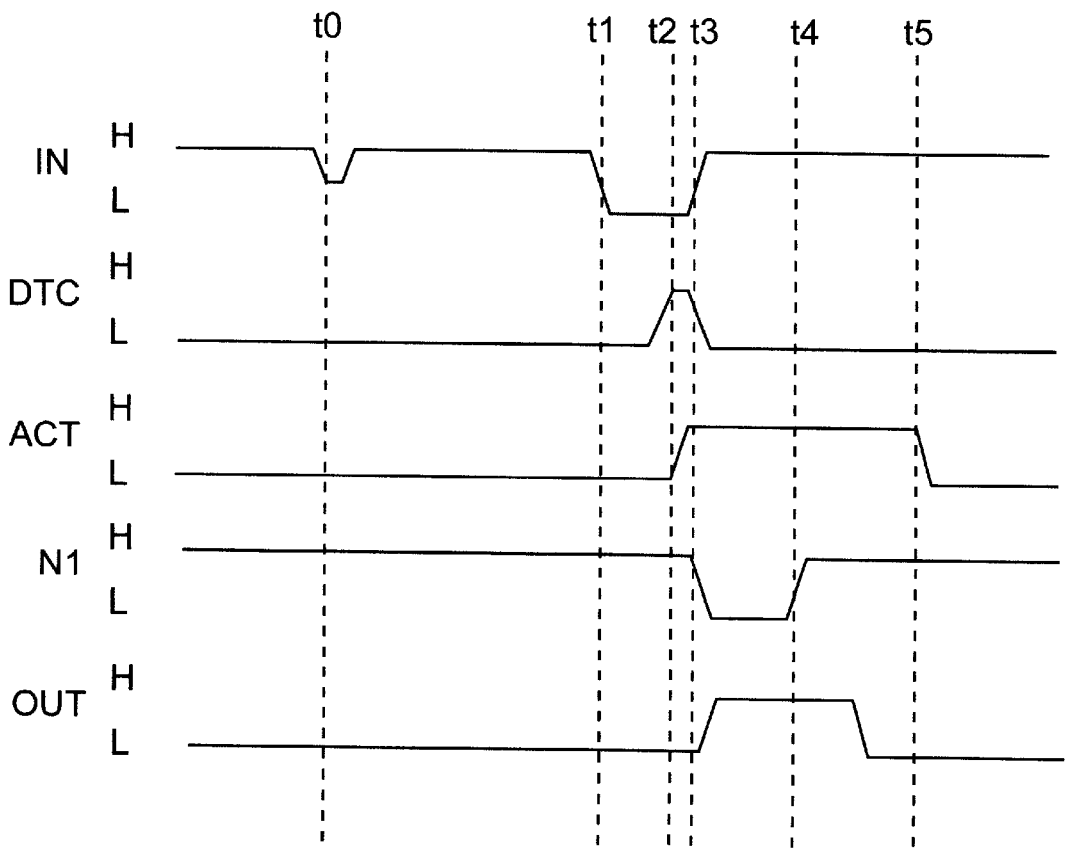
FIG. 7 is a timing chart illustrating operation of the signal transmitting circuit shown in FIG. 4

Next, the operation of the signal transmitting circuit 101 shown in FIG. 4 is explained below with reference to FIG. 7. In an initial state of the signal transmitting circuit 101, assuming that the voltage of the input signal IN is at the H level, the voltage of the detecting signal DTC is at the L level because the counting circuit 113 is in reset condition. Also, in this state, the voltage of the control signal ACT is at the L level. Therefore, since the control circuit 30 is in the first condition, the voltage at the node N1 is maintained at the H level. Accordingly, the voltage of the output signal OUT from the signal transmitting circuit 10 is at the L level.

At the time t0, assuming that the voltage of the input signal IN is changed by noise from the H level to the L level, the oscillator 111 is activated and generates a pulse signal. The counting circuit 113 starts to count the pulses. However, since the time period as a result of the noise during which the voltage level of the input signal IN is maintained at the L level is shorter than that for the four pulses to be generated, the voltage of the detecting signal DTC is maintained at the L level. Therefore, the voltage at the node N1 is maintained at the H level and the voltage of the output signal OUT is maintained at the L level.

At the time t1, the voltage of the input signal IN is changed to the L level as a result of the transfer of the data. At this time, the oscillator 111 is activated and generates the pulse signal and the counting circuit 113 starts to count the pulses. In this case, since the time period for which the voltage of the input signal IN is maintained at the L level is sufficient for the four pulses to be generated, the voltage level of the detecting signal DTC is changed to the H level at the time t2, wherein the time period from time t1 to time t2 corresponds to the generation of the four pulses. In response to the change of the voltage level of the detecting signal DCT to the H level, the voltage level of the control signal ACT is changed to the H level. Therefore, the control circuit 30 changes to the second condition.

At the time t3, the voltage level of the input signal IN returns to the H level. Therefore, the voltage of the detecting signal DTC is returned to the L level. However, the voltage level of the control signal ACT is not changed because the transmission of the change of the voltage level of the detecting signal DTC to the reset terminal R of the FF circuit 123 is delayed by the delay circuit 121. Therefore, the voltage level of the control signal ACT is maintained at the H level for the particular time period defined by the number of the inverters 121-1 . . . 121-m. Furthermore, since the input signal IN delayed by the delay circuit 20 is transferred to the node N1, the voltage at the node N1 is changed to the L level. Therefore, the voltage of the output signal OUT is changed to the H level.

From the description above, it is understandable that the length of delay caused by the delay circuit 20 should be set longer than the total processing time of the detecting circuit 110 and the control signal generating circuit 120. In other words, the length of the total delay provided by the delay circuit 20 is set longer than the time period from the time t1 to the time t2.

After a particular time period has been passed, at a time t4, the voltage at the node N1 is returned to the H level, and then, the voltage of the output signal OUT is returned to the L level. Therefore, at this moment, the input signal IN that is input at the input terminal 1 at the time t2 is output from the output terminal 3 as the output signal OUT, having been delayed by the desired length of time.

At a time t5, since the signal output by the delay circuit 121 of the control signal generating circuit 120 is at the H level, the voltage level of the control signal ACT is returned to the L level. Therefore, at the time t5, the signal transmitting circuit 101 is in a state similar to the initial state.

According to the second embodiment of the invention, in addition to providing the benefits of the first embodiment, since the control signal that controls the condition of the control circuit 20 is formed in response to the input signal IN, it is not necessary to form any terminals to receive the control signal that is formed in the peripheral device. Therefore, since it is not necessary to form the control signal in the peripheral device, dependency on the peripheral device can be reduced.

Next, an alternative signal transmitting circuit of the first embodiment is explained below with reference to FIG. 8. The same reference numbers in FIG. 1 and FIG. 8 designate the same or similar components. Comparing to the signal transmitting circuit 100 as the first embodiment shown in FIG. 1, the alternative signal transmitting circuit 200 includes the signal transmitting circuit 15 having pulse generating function, instead of the signal transmitting circuit 10 having delay function. Therefore, the alternative signal transmitting circuit 200 further includes an alternative control circuit 230, instead of the control circuit 30.

The alternative control circuit 230 includes two NMOS transistors 30-1, 230-1 and an inverter 230-2. The drain of the NMOS transistor 30-1 is connected to the last inverter 20-n of the delay circuit 20, and the source is connected to an node N2 which is connected to the input of the signal transmitting circuit 15. The gate of the NMOS transistor 30-1 is connected to the terminal 5 to receive the control signal AL. The drain of the NMOS transistor 230-1 is connected to the node N2, and source is connected to the Vss. The input of the inverter 230-2 is connected to the terminal 5, and its output is connected to the gate of the NMOS transistor 230-1.

When the voltage the control signal AL is at the L level, the NMOS transistor 30-1 is in the off-state, and the NMOS transistor 230-1 is in the on-state in the control circuit 230. Therefore, under this circumstance, the voltage level at node N2 is maintained at the L level because the Vss is applied at the node N2 through the NMOS transistor 230-1. This condition of the current pass corresponds to the first condition in the first embodiment.

When the control signal AL is at the H level, the NMOS transistor 30-1 is in the on-state, and the NMOS transistor 230-1 is in the off-state in the control circuit 230. The voltage level at the node N2 corresponds to the voltage level of the signal which is output from the delay circuit 20. This condition of the current pass corresponds to the second condition in the first embodiment.

According to the alternative signal transmitting circuit 230, as well as the first embodiment, it is possible to avoid the influence of the noise by controlling the control circuit 230 with the control signal AL. Further, comparing the control circuit 230 with the control circuit 30, since only one component, that is, inverter 230-2 is added, an occupied area of the control circuit 230 is almost the same as that of the control circuit 30. Furthermore, a PMOS transistor can be replaced by the NMOS transistor 230-1. If a PMOS transistor is used in the control circuit 230, it is not necessary to provide the inverter 230-2. Therefore, the number of the component consisting of control circuit 230 can be reduced.

Next, an alternative signal transmitting circuit of the second embodiment is explained below with reference to FIG. 9. The same reference numbers in FIGS. 4 and 8 and FIG. 9 designate the same or similar components. Comparing to the signal transmitting circuit 101 as the first embodiment shown in FIG. 1, the alternative signal transmitting circuit 201 includes the signal transmitting circuit 15 having pulse generating function, instead of the signal transmitting circuit 10 having delay function. Therefore, the alternative signal transmitting circuit 201 further includes an alternative control circuit 230, instead of the control circuit 30. Other components of the alternative signal transmitting circuit 201 shown in FIG. 9 is the same as components of the signal transmitting circuit 101 shown in FIG. 4. Therefore, the alternative signal transmitting circuit 201 shown in FIG. 9 is a kind of a combination circuit having features of the signal transmitting circuits shown in FIG. 4 and FIG. 8.

Figure 8:
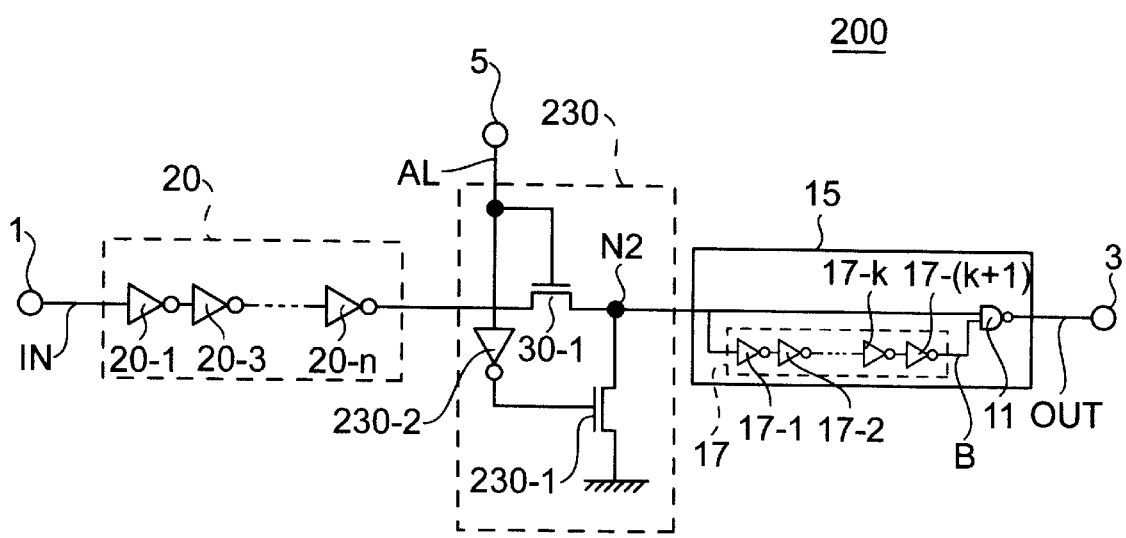
FIG. 8 is a circuit diagram of an alternative to the signal transmitting circuit of the first embodiment.
Figure 9:
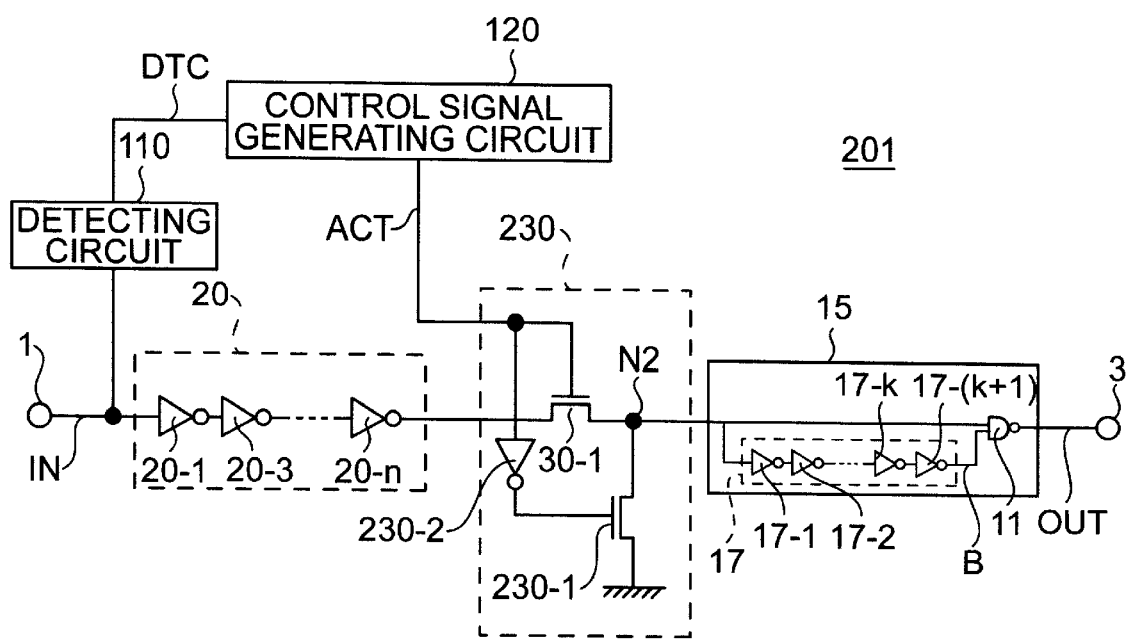
FIG. 9 is a circuit diagram of an alternative to the signal transmitting circuit of the second embodiment.

According to the alternative signal transmitting circuit 201 shown in FIG. 9, in addition to providing the benefits of the circuit shown in FIG. 4, the benefits of the circuit 230 shown in FIG. 8 can be obtained. In the description above, the invention is applied to several signal transmitting circuits having a delay function or a pulse generating function. However, the invention can be used in any signal transmitting circuits. Further, this invention can be applied to the signal transmitting circuit regardless of the voltage level of the input signal which is input during the initial state of the signal transmitting circuit.

Figure 10:
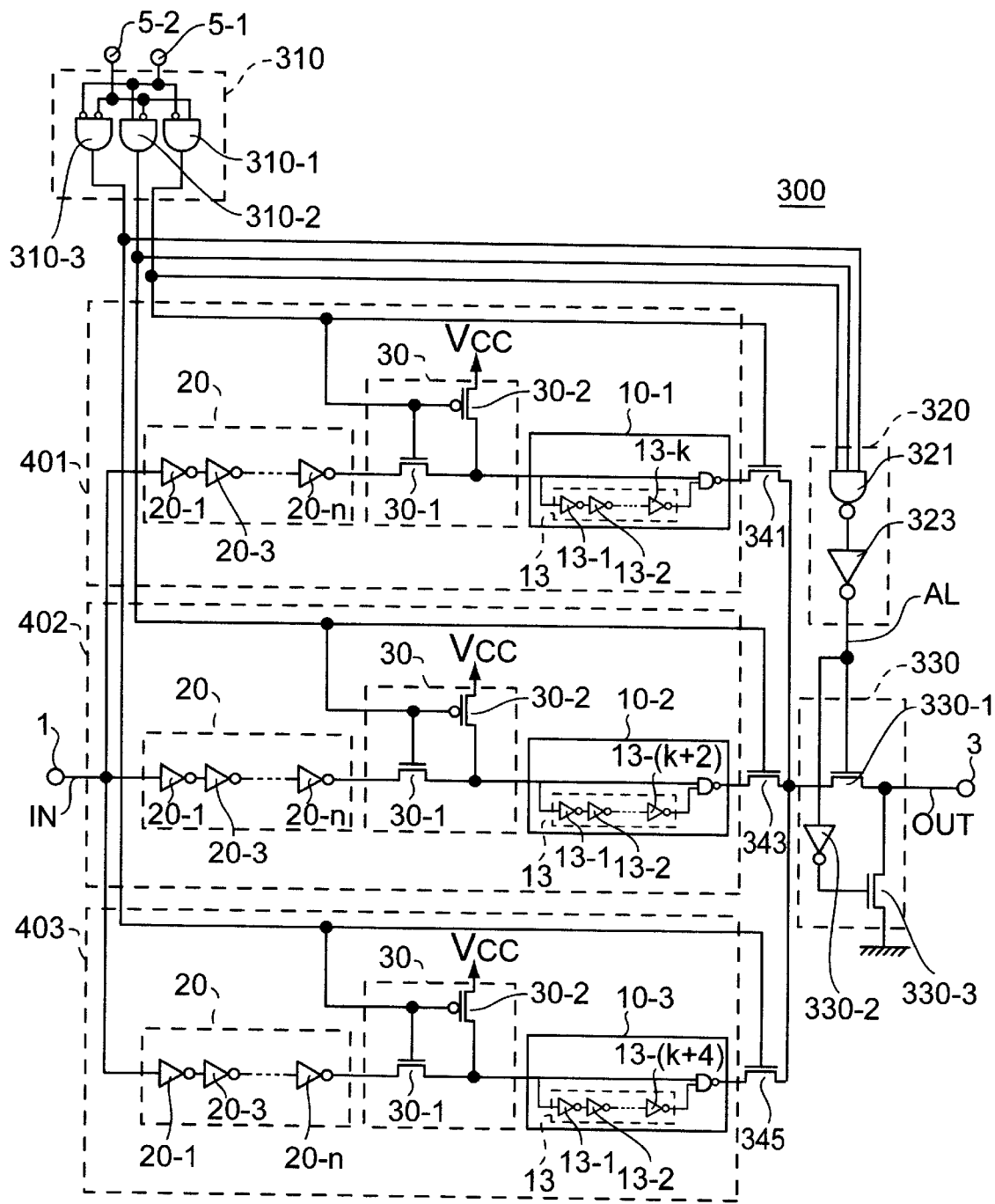
FIG. 10 is a circuit diagram of another alternative to the signal transmitting circuit of the first embodiment.

Referring to FIG. 10, a signal transmitting circuit 300 includes an additional control circuit 330, a select circuit consisting of a first gate circuit 310 and a second gate circuit 320 and three signal transmitting circuits 401, 402, 403 each similar to the signal transmitting circuit 100 of the first embodiment connected between an input terminal 1 and the additional control circuit 330. Signal transmitting circuits 10-1, 10-2, 10-3 shown in FIG. 10 of the respective circuit 401, 402, 403 are similar to the signal transmitting circuit 10 shown in FIG. 12 and to each other, but they are not identical. That is, they differ in the number of inverters. Therefore, the signal delay times of the signal transmitting circuits 401, 402, 403 are different.

The first gate circuit 310 of the select circuit includes three two-input AND gates 310-1, 310-2, 310-3. The AND gate 310-1 receives an inverted signal of a signal from a terminal 5-1 and a signal from a terminal 5-2. The AND gate 310-2 receives an inverted signal of the signal from the terminal 5-2 and the signal from the terminal 5-1. The AND gate 310-3 receives the inverted signal of the signal from the terminal 5-1 and the inverted signal of the signal from the terminal 5-2. That is, the control signal AL shown in FIG. 1 is used to provide two bits of control information to the entire circuit 300 shown in FIG. 10. To receive the two bit of the control information, two terminals 5-1, 5-2 are provided. In the first gate circuit 310, only AND circuit 310-1 outputs the H level signal when the voltage at the terminal 5-1 is at the H level and the voltage at the terminal 5-2 is at the L level. Similarly, only AND circuit 310-2 outputs the H level signal when the voltage at the terminal 5-1 is at the L level and the voltage at the terminal 5-2 is at the H level. Further, only AND circuit 310-3 outputs the H level signal when the voltage at the terminal 5-1 is at the H level and the voltage at the terminal 5-2 is at the H level. Moreover, none of the AND circuits 310-1, 310-2, 310-3 output the H level signal when the voltage at the terminal 5-1 is at the L level and the voltage at the terminal 5-2 is at the L level.

The second gate circuit 320 includes a three-input NOR gate 321 and an inverter 323. The output signals from the AND gates 310-1, 310-2, 310-3 are input to the NOR gate 321. The output from the NOR gate 321 is input to the control circuit 330 as the control signal AL, via the inverter 323. Therefore, the second gate circuit 320 outputs the H level signal while one of the output signals from the AND gates 310-1, 310-2, 310-3 is maintained at the H level, and outputs the L level signal otherwise.

The additional control circuit 330 has a similar structure to the control circuit 230 shown in FIG. 8. That is, the control circuit 330 includes two NMOS transistors 330-1, 330-3 and an inverter 330-2. The gate of the NMOS transistor 330-1 receives the control signal AL from the second gate circuit 320, and the NMOS transistor 330-3 receives the control signal /AL, which is inverted by the inverter 330-2.

The signal transmitting circuit 300 also includes three NMOS transistors 341, 342, 343 which are connected between the additional control circuit 330 and the signal transmitting circuits 10-1, 10-2, 10-3, respectively. The gate of the NMOS transistor 341 receives the output from the AND gate 310-1. The gate of the NMOS transistor 342 receives the output from the AND gate 310-2. The gate of the NMOS transistor 343 receives the output from the AND gate 310-3.

The signal transmitting circuit 300 permits selection of the delay time of the signal input at terminal 1 and output at terminal 3. For example, assuming that the voltage level of the signals at terminals 5-1, 5-2 are both initially at the L, all of the AND gates 310-1, 310-2, 310-3 output signals at the L level. Therefore, the control circuits 30 of the respective circuits 401, 402, 403, which are connected to the signal transmitting circuits 10-1, 10-2, 10-3, respectively, are in the first condition, and the NMOS transistors 341, 343, 345 are in the off-state. Also, the second gate circuit 320 outputs the control signal AL at the L level. Therefore, the NMOS transistor 330-1 is in the off-state, and the NMOS transistor 330-3 is in the on-state. Accordingly, since the additional control circuit 330 is in the first condition, the voltage at the terminal 3 is maintained at the L level even if the voltage level at the terminal 1 is changed by noise.

Next, when the input signal IN as data is input at the terminal 1, the control information, which corresponds to the desired delay time, is input at the terminals 5-1, 5-2. As an example, assuming that the signal transmitting circuit 402 is selected, the signal at the L level is input at the terminal 5-1, and the signal at the H level is input at the terminal 5-2, as the control information. In response to the control information, only AND circuit 310-2 outputs the H level signal. As a result, only control circuit 30, connected to the signal transmitting circuit 10-2, goes to the second condition, and the NMOS transistor 343 turns on. Further, as the control signal AL, which is output from the second gate circuit 320, is change to the H level, the additional control circuit 330, goes to the second condition. Therefore, the input signal IN at the terminal 1 is input to the signal transmitting circuit 10-2 in the signal transmitting circuit 402, and the output from the signal transmitting circuit 10-2 is transferred to the terminal 3 via the additional control circuit 330.

Similarly, either the signal transmitting circuit 401 or the signal transmitting circuit 403 can be selected by changing the voltage level of the signals which are input to the terminals 5-1, 5-2. According to the signal transmitting circuit 300 shown in FIG. 10, in addition to obtaining the benefits of the circuit of the first embodiment, the delay time of the signal can be selected.

Figure 11:
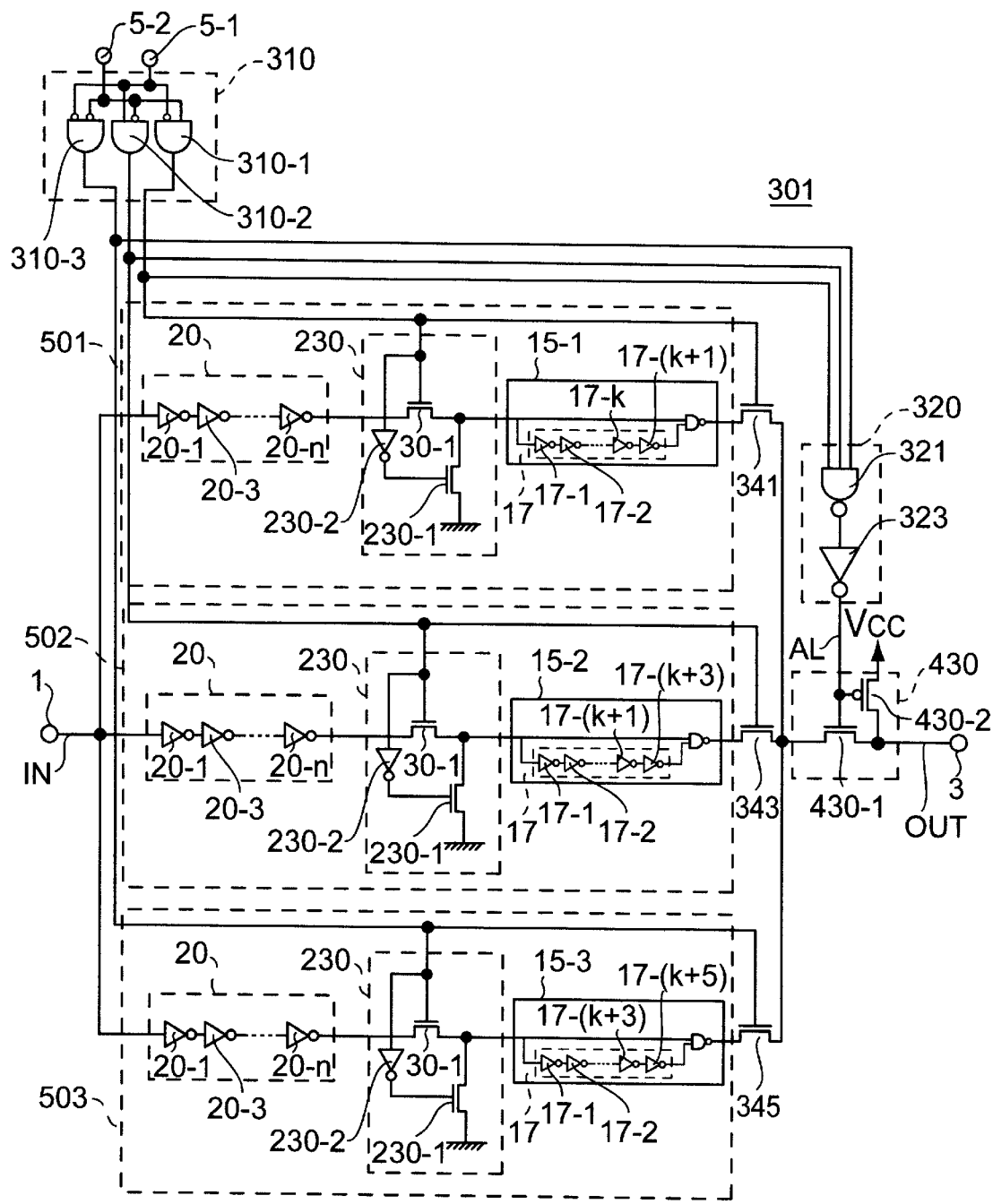
FIG. 11 is a circuit diagram of another alternative to the alternative signal transmitting circuit of the first embodiment.
Figure 13:
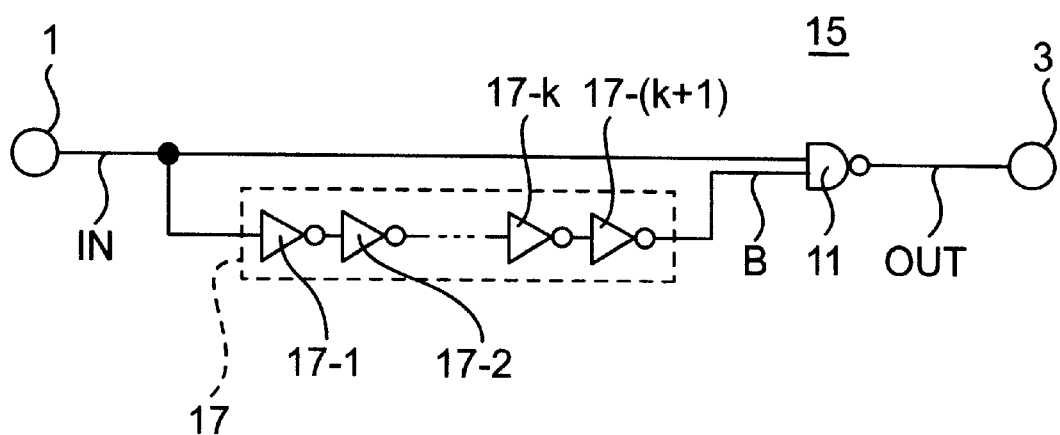
FIG. 13 is a circuit diagram of a signal transmitting circuit in the related arts having a pulse generating function.
Figure 14:
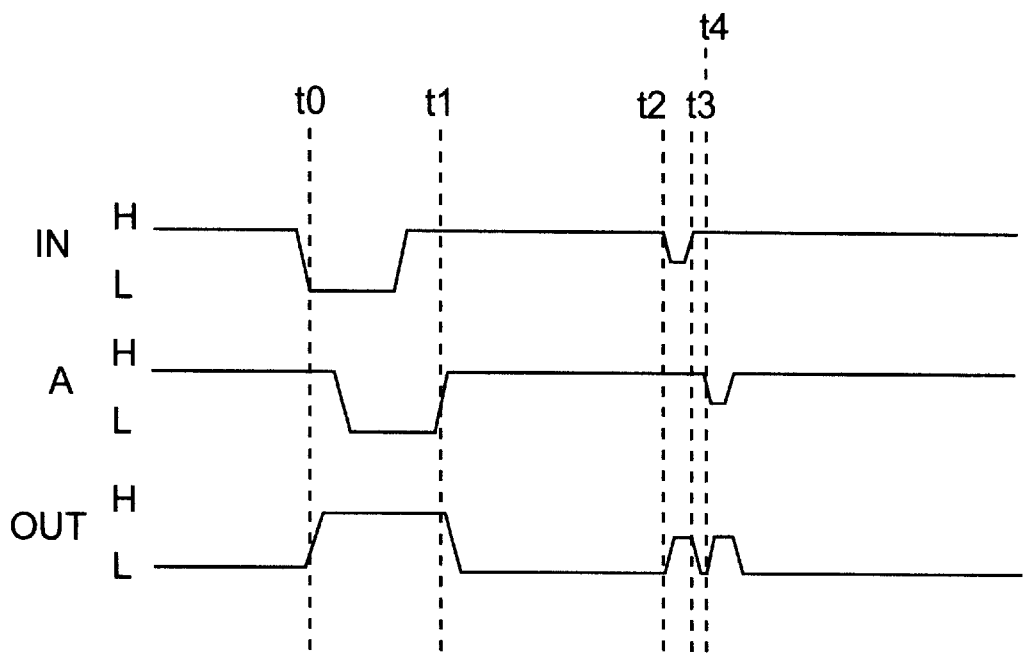
FIG. 14 is a timing chart illustrating operation of the signal transmitting circuit shown in FIG. 12.
Figure 15:
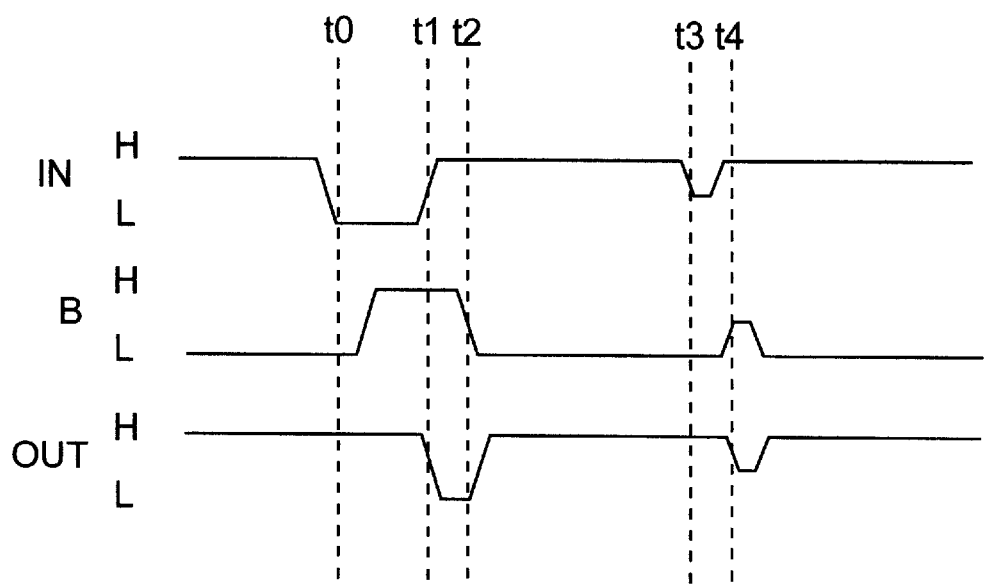
FIG. 15 is a timing chart illustrating operation of the signal transmitting circuit shown in FIG. 13.

Referring to FIG. 11, a signal transmitting circuit 301 includes an additional control circuit 430, a select circuit consisting of a first gate circuit 310 and a second gate circuit 320 and three signal transmitting circuits 501, 502, 503 each similar to the signal transmitting circuit 200 shown in FIG. 8, connected between an input terminal 1 and the additional control circuit 430. Signal transmitting circuits 15-1, 15-2, 15-3 of the respective circuit 501, 502, 503 shown in FIG. 15 are similar to the signal transmitting circuit 15 shown in FIG. 13 and to each other, but they are not the identical. That is, they differ in the number of inverters. Therefore, each signal transmitting circuit 401, 402, 403 generates a pulse signal at the different time, in response to the input signal.

The additional control circuit 430 has a similar structure to the control circuit 30 shown in FIG. 1. That is, the control circuit 430 includes an NMOS transistor 430-1 and a PMOS transistor 430-2. Both gates of the NMOS transistor 430-1 and the PMOS transistor 430-2 receive a control signal AL from a second gate circuit 320. Therefore, the signal transferring circuit 301 shown in FIG. 11 uses the signal transmitting circuit 15-1, 15-2, 15-3 acting as a pulse generating circuit, instead of the signal transmitting circuit 10-1, 10-2, 10-3 acting as a delay circuit shown in FIG. 10. Accordingly, although the voltage levels of signals to be input to the terminals 5-1, 5-2 in the circuit 301 in FIG. 11 is different from them in the circuit 300 in FIG. 10, the operation of the signal transmitting circuit 301 is similar to the signal transmitting circuit 300.

The signal transmitting circuit 301 permits selection of the timing that the pulse signal is generated. In FIG. 10 and FIG. 11, the signal transmitting circuits acting as the delay circuit and the pulse generating circuit are explained, respectively as the examples. However, the inventions shown in FIG. 10 and FIG. 11 can be used in any signal transmitting circuits. Further, this invention can be applied to the signal transmitting circuit regardless of the voltage level of the input signal which is input during the initial state of the signal transmitting circuit.

While the invention has been described with reference to illustrative embodiments, this description is not intended to be construed in a limiting sense. Various other modifications of the illustrated embodiments, as well as other embodiments of the invention, will be apparent to those skilled in the art on reference to this description. For example, three delay circuits 20 and three control circuits 30 or 230 in FIG. 10 or FIG. 11 can be changed to a single delay circuit and a single control circuit. To be concrete, three NMOS transistors whose gates are connected to the gates of the NMOS transistors 341, 343, 345, respectively, are connected between the inputs of the signal transmitting circuits 10-1, 10-2, 103 and the single control circuit, respectively in the signal transmitting circuit shown in FIG. 10. Further, in the signal transmitting circuit shown in FIG. 11, three NMOS transistors whose gates are connected to the gates of the NMOS transistors 341, 343, 345 respectively, are connected between the inputs of the signal transmitting circuits 15-1, 15-2, 153 and the single control circuit, respectively. According to these embodiments, although it takes time to make the voltage level of the signal from the selected signal transmitting circuit stable, it is possible to reduce the number of components.

Further, it is possible to control the control circuits 30 in FIG. 10 or the control circuits 230 in FIG. 11 by using the detecting circuit 110 and the control signal generating circuit 120 shown in FIG. 4 or FIG. 9. Moreover, the first gate circuit 310 or the second gate circuit can be replaced by a three-input OR gate. Furthermore, although the signal transmitting circuits shown in FIG. 10 and FIG. 11 are controlled by two-bit control information, it may be controlled by three or more bits of control information. In this case, additional signal transmitting circuits 10 or 15 should be included in order to response to the variation of the delay time or the time that the pulse signal is generated. Therefore, the appended claims are intended cover any such modifications or embodiments as fall within the true scope of the inventon.

What I claim is:

1. A signal transmitting circuit for processing an input signal at an input terminal, and for outputting the processed signal from an output terminal, comprising;

a control circuit controlling selectively between a first condition and a second condition as to a current pass in response to a control signal, wherein the first condition indicates that the signal is prohibited from transferring to the input node so that a voltage level at the input node is held at a predetermined voltage level, and the second condition indicates that the signal is allowed to transfer to the input node so that a voltage level at the input node is no longer held at the predetermined voltage level, a detecting circuit, which is operated by a change of the voltage level of the input signal, detecting whether the input signal is a desired signal, and outputting the detected signal in response to the result of the detection, and a control signal generating circuit outputting the control signal, which has a voltage level for forcing the control circuit to be in the second condition, for a predetermined period, in response to the detected signal.

2. A signal transmitting circuit as claimed in claim 1, further comprising a delay circuit connected between the input terminal and the control circuit outputting a signal having a voltage level substantially equal to that of the input signal.

3. A signal transmitting circuit as claimed in claim 1, wherein the control signal and the input signal are input from outside of a device having the signal transmitting circuit.

4. A signal transmitting circuit as claimed in claim 2, wherein the control signal and the input signal are input from outside of a device having the signal transmitting circuit.

5. A signal transmitting circuit as claimed in claim 1, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

6. A signal transmitting circuit as claimed in claim 2, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

7. A signal transmitting circuit as claimed in claim 3, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

8. A signal transmitting circuit as claimed in claim 4, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

9. A signal transmitting circuit for processing an input signal at an input terminal, and for outputting the processed signal from an output terminal, comprising:

a control circuit controlling selectively between a first condition and a second condition as to a current pass in response to a control signal, wherein the first condition indicates that the signal is prohibited from transferring to the input node so that a voltage level at the input node is held at a predetermined voltage level, and the second condition indicates that the signal is allowed to transfer to the input node so that a voltage level at the input node is no longer held at the predetermined voltage level, and a second signal transmitting circuit which is connected between the output terminal and the control circuit, the second signal transmitting circuit having a delay circuit for delaying the input signal and a logic circuit receiving the input signal and a first signal outputted from the delay circuit, and the second signal transmitting circuit outputting a second signal from the logic circuit.

10. A signal transmitting circuit for processing an input signal at an input terminal, and for outputting the processed signal from an output terminal, comprising:

a control circuit controlling selectively between a first condition and a second condition as to a current pass in response to a control signal, wherein the first condition indicates that the signal is prohibited from transferring to the input node so that a voltage level at the input node is held at a predetermined voltage level, and the second condition indicates that the signal is allowed to transfer to the input node so that a voltage level at the input node is no longer held at the predetermined voltage level, and a second signal transmitting circuit which is connected between the output terminal and the control circuit, the second control circuit having a function for generating a pulse signal having a predetermined pulse width in response to the input signal.

11. A signal transmitting circuit as claimed in claim 9, further comprising a delay circuit connected between the input terminal and the control circuit outputting a signal having a voltage level substantially equal to that of the input signal.

12. A signal transmitting circuit as claimed in claim 9, wherein the control signal and the input signal are input from outside of a device having the signal transmitting circuit.

13. A signal transmitting circuit as claimed in claim 11, wherein the control signal and the input signal are input from outside of a device having the signal transmitting circuit.

14. A signal transmitting circuit as claimed in claim 9, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

15. A signal transmitting circuit as claimed in claim 11, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

16. A signal transmitting circuit as claimed in claim 12, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

17. A signal transmitting circuit as claimed in claim 13, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

18. A signal transmitting circuit as claimed in claim 10, further comprising a delay circuit connected between the input terminal and the control circuit outputting a signal having a voltage level substantially equal to that of the input signal.

19. A signal transmitting circuit as claimed in claim 10, wherein the control signal and the input signal are input from outside of a device having the signal transmitting circuit.

20. A signal transmitting circuit as claimed in claim 18, wherein the control signal and the input signal are input from outside of a device having the signal transmitting circuit.

21. A signal transmitting circuit as claimed in claim 10, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

22. A signal transmitting circuit as claimed in claim 18, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

23. A signal transmitting circuit as claimed in claim 19, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

24. A signal transmitting circuit as claimed in claim 20, wherein the signal transmitting circuit includes a plurality of the control circuits and the signal transmitting circuit receives a plurality of the control signals which are multi-bit selecting information, and, further comprising a select circuit forcing one of the control circuits to be in the second condition in response to the multi-bit selecting information.

* * * * *